United States Patent
Chu

(10) Patent No.: US 11,324,129 B2
(45) Date of Patent: May 3, 2022

(54) FLEXIBLE DISPLAY SCREEN ASSEMBLY AND FLEXIBLE DISPLAY DEVICE

(71) Applicant: BOE TECHNOLOGY GROUP CO., LTD., Beijing (CN)

(72) Inventor: Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 16/478,830

(22) PCT Filed: Jan. 9, 2019

(86) PCT No.: PCT/CN2019/070954
§ 371 (c)(1),
(2) Date: Jul. 17, 2019

(87) PCT Pub. No.: WO2019/223334
PCT Pub. Date: Nov. 28, 2019

(65) Prior Publication Data
US 2021/0337676 A1    Oct. 28, 2021

(30) Foreign Application Priority Data
May 22, 2018  (CN) .......................... 201810499775.6

(51) Int. Cl.
| H05K 5/00 | (2006.01) |
| H01L 27/32 | (2006.01) |
| H01L 51/00 | (2006.01) |
| H01L 51/52 | (2006.01) |

(52) U.S. Cl.
CPC ....... *H05K 5/0017* (2013.01); *H01L 27/3244* (2013.01); *H01L 51/0097* (2013.01); *H01L 51/5237* (2013.01); *H01L 2251/5338* (2013.01)

(58) Field of Classification Search
None
See application file for complete search history.

(56) References Cited

U.S. PATENT DOCUMENTS

| 9,786,207 | B2 | 10/2017 | Kim et al. |
| 10,032,391 | B2 | 7/2018 | Kim et al. |
| 10,223,942 | B2 | 3/2019 | Chu |
| 2013/0342090 | A1 | 12/2013 | Ahn et al. |
| 2015/0333297 | A1 | 11/2015 | Liu et al. |
| 2017/0061836 | A1 | 3/2017 | Kim et al. |

(Continued)

FOREIGN PATENT DOCUMENTS

| CN | 103682158 A | 3/2014 |
| CN | 104732890 A | 6/2015 |

(Continued)

OTHER PUBLICATIONS

First Chinese Office Action dated Oct. 28, 2019, received for corresponding Chinese Application No. 201810499775.6, 9 pages.

*Primary Examiner* — Vip Patel
(74) *Attorney, Agent, or Firm* — Kinney & Lange, P.A.

(57) ABSTRACT

A flexible display screen assembly is disclosed. The flexible display screen assembly includes: a frame; and a flexible display screen adapted to the frame. The flexible display screen includes at least one first fixing member, and the frame includes at least one second fixing member that cooperates with the at least one first fixing member. The flexible display screen includes a functional film, and the at least one first fixing member is disposed on the functional film.

19 Claims, 4 Drawing Sheets

(56) References Cited

U.S. PATENT DOCUMENTS

2017/0278436 A1    9/2017   Chu
2017/0365197 A1   12/2017   Kim et al.

FOREIGN PATENT DOCUMENTS

| | | |
|---|---|---|
| CN | 205943345 U | 2/2017 |
| CN | 106486018 A | 3/2017 |
| CN | 206021147 U | 3/2017 |
| CN | 206270800 U | 6/2017 |
| CN | 107067982 A | 8/2017 |
| CN | 207268258 U | 4/2018 |
| CN | 108010451 A | 5/2018 |
| CN | 108520703 A | 9/2018 |
| JP | 2002351347 A | 12/2002 |

FLEXIBLE DISPLAY SCREEN ASSEMBLY AND FLEXIBLE DISPLAY DEVICE

CROSS-REFERENCE TO RELATED APPLICATION

This application is a Section 371 National Stage Application of International Application No. PCT/CN2019/070954, filed on Jan. 9, 2019, entitled "FLEXIBLE DISPLAY SCREEN ASSEMBLY AND FLEXIBLE DISPLAY DEVICE", which claims priority to Chinese Patent Application No. 201810499775.6 filed on May 22, 2018 with CNIPA, incorporated herein by reference in entirety.

TECHNICAL FIELD

Embodiments of the present disclosure relate to the field of display technology, and in particular, to a flexible display screen assembly and a flexible display device.

BACKGROUND

With the increasing demand for liquid crystal display products, especially for portable display terminals such as mobile phones, tablet computers and the like, it is required for these display terminals to not only have larger display screens, but also to be easily carried. The emergence of products of flexible display screen provides a feasible solution for achieving the above objects. For example, a product of flexible display screen may be switched between a large-area display in an extended and flat state of the display screen and a small-area display in a folded state of the display screen by using different designs of rotation shaft structure, to achieve display requirements of different sizes.

In practical applications, when a display device using a product of flexible display screen is in the folded state of the display screen for a long time, an adhesive for attaching the flexible display screen to a frame of the display device is susceptible to creep due to a long-term pulling force, which causes the flexible display screen to move relative to the frame, and thereby affects the display effect.

SUMMARY

According to one aspect of the present disclosure, there is provided a flexible display screen assembly, comprising:
a frame; and
a flexible display screen adapted to the frame,
wherein the flexible display screen comprises at least one first fixing member, and the frame comprises at least one second fixing member that cooperates with the at least one first fixing member; and
wherein the flexible display screen comprises a functional film, and the at least one first fixing member is disposed on the functional film.

In some embodiments, the functional film and the at least one first fixing member are integrally formed.

In some embodiments, the at least one first fixing member comprises a plurality of first fixing members, and the plurality of first fixing members are disposed on at least two opposite sides of the functional film.

In some embodiments, the first fixing members are disposed at respective peripheral sides of the functional film.

In some embodiments, a plurality of said first fixing members spaced apart from each other are disposed on each side of the functional film.

In some embodiments, the flexible display screen comprises a bendable zone and a non-bendable zone, and the at least one first fixing member is disposed on a side of the functional film located in the non-bendable zone.

In some embodiments, the flexible display screen is attached to the frame by an adhesive disposed between the frame and the functional film.

In some embodiments, the flexible display screen further comprises a flexible screen body and a reinforcing protection film;
wherein the reinforcing protection film is attached to a display surface of the flexible screen body, and the functional film is attached to the other surface of the flexible screen body facing away from the display surface.

In some embodiments, a projection of the at least one first fixing member on the flexible screen body is located outside a projection of the functional film on the flexible screen body.

In some embodiments, the at least one first fixing member is a hollow slot and the at least one second fixing member is a protruding plug that cooperates with the hollow slot.

In some embodiments, the at least one first fixing member is a retaining tab and the at least one second fixing member is a retaining slit that cooperates with the retaining tab.

In some embodiments, the functional film is formed by assembling together and superposing a plurality of functional sub-layers, and the at least one first fixing member is disposed on at least one of the plurality of functional sub-layers.

In some embodiments, the functional sub-layers comprise: a bubble removing sub-layer, a buffering and shock absorbing sub-layer, a heat dissipating and temperature homogenizing sub-layer, and a thermally conductive and shielding sub-layer, wherein the at least one first fixing member is integrally formed with at least one of the bubble removing sub-layer, the buffering and shock absorbing sub-layer, the heat dissipating and temperature homogenizing sub-layer, and the thermally conductive and shielding sub-layer.

In some embodiments, the flexible display screen assembly is configured for OLED display and/or AMOLED display.

According to another aspect of the present disclosure, there is provided a flexible display device, comprising the flexible display screen assembly according to any one of the above embodiments.

Other objects and advantages of the present disclosure will be apparent from the description of the present disclosure with reference to the accompanying drawings below, and the description can be helpful for understanding the present disclosure comprehensively.

DETAILED DESCRIPTION OF EMBODIMENTS

Figure 1:
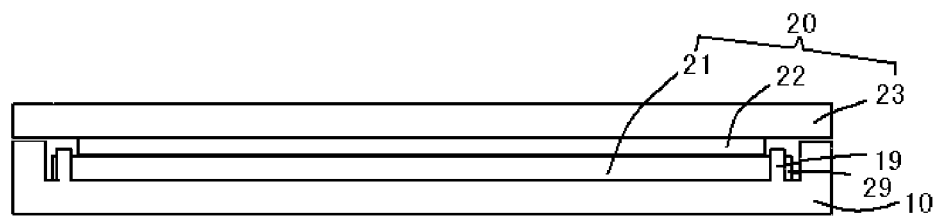
FIG. 1 is a side structural view schematically illustrating a flexible display screen assembly according to an embodiment of the present disclosure.

The technical solutions of the present disclosure will be further described below in detail by way of embodiments with reference to the accompanying drawings. In the description, the same or similar reference numerals indicate the same or similar parts. The description of the embodiments of the present disclosure with reference to the accompanying drawings is intended to explain the general inventive concept of the present disclosure, and should not be construed as limiting the present disclosure.

In the following detailed description, for the convenience of explanation, numerous specific details are set forth to provide a comprehensive understanding of the embodiments of the present disclosure. Obviously, however, one or more embodiments may be implemented without these specific details. In other instances, well-known structures and devices are schematically shown in the drawings so as to simplify the drawings.

In addition, in the following detailed description, terms related to spatial locations (including but not limited to "below", "above", "underneath", "under", "above" and "at top of", if used herein, are used to facilitate describing a spatial relationship of one element relative to another. Such terms related to spatial locations encompass different orientations of the device in use or operation in addition to the particular orientations shown in the drawings and described herein. For example, if the objects shown in the drawings are turned over or turned around, the previously described portions below or under other elements are then above these other elements.

The object of embodiments of the present disclosure is to address at least one aspect of the problems and deficiencies that exist in the prior art.

At least one object of embodiments of the present disclosure is to provide a flexible display screen assembly capable of enhancing a fixing function between a flexible display screen and a housing to prevent displacement of a flexible display screen relative to a frame in a folded state, thereby ensuring display effect.

Another object of embodiments of the present disclosure is to provide a flexible display device capable of enhancing a fixing function between a flexible display screen and a housing to prevent displacement of a flexible display screen relative to a frame in a folded state, thereby ensuring display effect.

According to a general technical concept of embodiments of the present disclosure, there is provided a flexible display screen assembly, including a frame and a flexible display screen adapted to the frame. The flexible display screen has a first fixing member, the frame has a corresponding second fixing member, and the first fixing member and the second fixing member cooperate with each other to fix the flexible display screen onto the frame. The flexible display screen includes a functional composite film, and the first fixing member is disposed on the functional composite film. Moreover, an embodiment of the present disclosure also provides a flexible display device including the aforementioned flexible display screen assembly.

Figure 2:
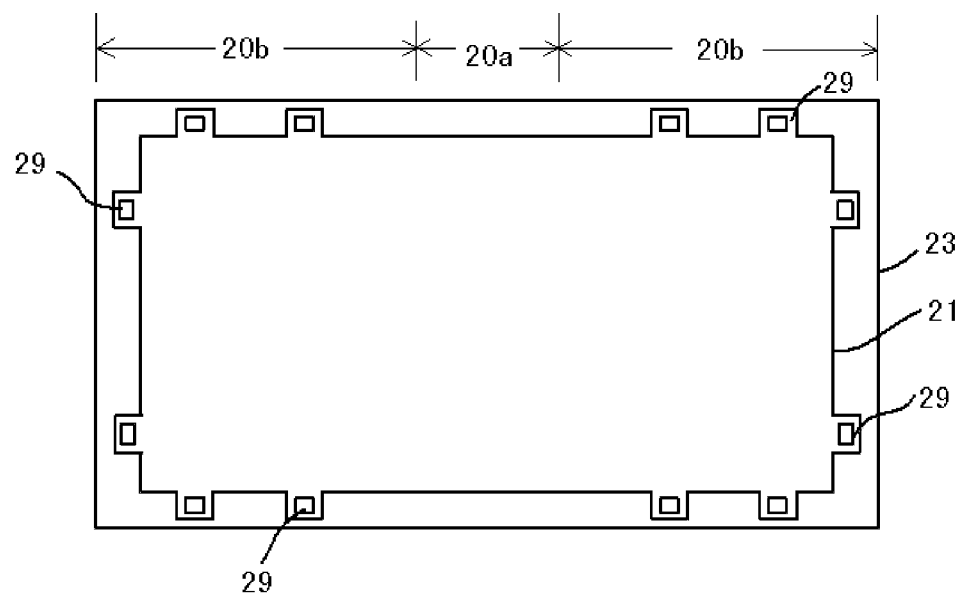
FIG. 2 is a bottom structural view schematically illustrating a flexible display screen in the flexible display screen assembly shown in FIG. 1.
Figure 3:
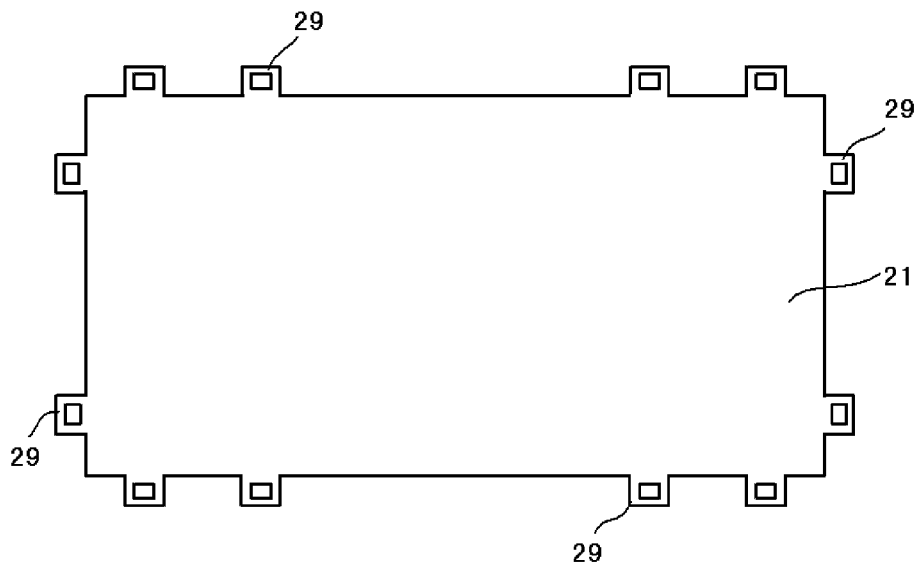
FIG. 3 is a bottom structural view schematically illustrating a functional composite film in the flexible display screen shown in FIG. 2.

FIG. 1 is a side structural view schematically illustrating a flexible display screen assembly according to an embodiment of the present disclosure; FIG. 2 is a bottom structural view schematically illustrating a flexible display screen in the flexible display screen assembly shown in FIG. 1; and FIG. 3 is a bottom structural view schematically illustrating a functional composite film in the flexible display screen shown in FIG. 2. It should be noted that, in order to clearly show internal assembly structures of the flexible display screen assembly, FIG. 1 shows various components of the flexible display screen assembly, and positional relationships therebetween and assembly relationships thereof in a perspective view from a side view, and in FIG. 1, the cross section is particularly taken along positions where the first and second fixing members are located, to show the cooperation relationship between the two.

According to some embodiments of the present disclosure, there is provided a flexible display screen assembly, which is mainly applied in a flexible display screen structure of a flexible liquid crystal display device, capable of performing a large-area display in an extended and flat state of the display screen and a small-area display in a folded state of the display screen respectively, and thereby achieves display requirements of different sizes.

Referring to FIGS. 1 to 3, a flexible display screen assembly is provided. It mainly includes a frame 10 and a flexible display screen 20 adapted to the frame 10, for example, the flexible display screen 20 is disposed within the frame 10 or at least partially disposed within the frame 10. The frame 10 may be a metal frame for providing enough support strength for the entire assembly. The flexible display screen 20 is attached to the frame 10, specifically to an inner surface of the frame 10, by an adhesive. According to some embodiments of the present disclosure, in the above flexible display screen assembly, the flexible display screen 20 has first fixing members 29 and the frame 10 has corresponding second fixing members 19, wherein the first fixing members 29 and the second fixing members 19 cooperate with and are fastened to each other to secure the flexible display screen 20 to the frame 10. Specifically, the flexible display screen 20 includes a functional composite film 21, and the first fixing members 29 are disposed on the functional composite film 21. In this way, by the mutual fastening cooperation between the first fixing members 29 and the second fixing members 19, even if the adhesive between the flexible display screen 20 and the frame 10 is subjected to creep due to a long-term pulling force in the folded state of the display screen, the flexible display screen 20 may be still fixed at the original position of the frame 10, preventing the flexible display screen from being displaced relative to the frame, and thereby ensuring the display effect. The first fixing members 29 and the second fixing members 19 are engaged with each other in the extended and flat state of the display screen and the folded state of the display screen.

More specifically, as shown in FIGS. 1 and 3, in the above flexible display screen assembly, the flexible display screen 20 includes, but not limited to, the aforementioned functional composite film 21, a flexible screen body 22, and a reinforcing protection film 23. The reinforcing protection film 21 is attached to a display surface of the flexible screen body 22 (for example, attached to an upper surface of the flexible screen body 22 as shown in FIG. 1), and the functional composite film 21 is attached to another surface of the flexible screen body 22 facing away from the display surface (for example, attached to a lower surface of the flexible screen body 22 as shown in FIG. 1).

Figure 5:
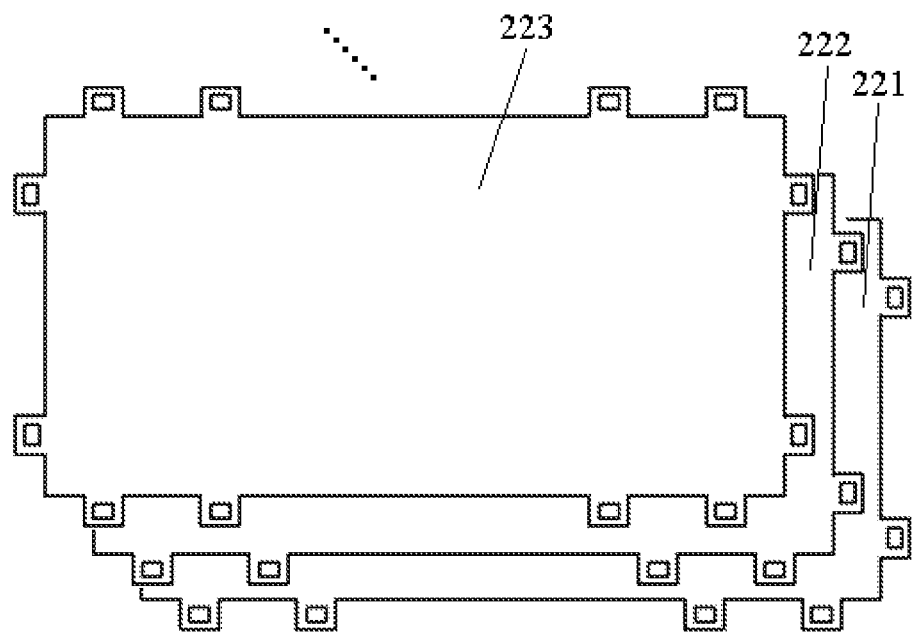
FIG. 5 schematically illustrates a plurality of functional sub-layers of a functional composite film of a flexible display screen assembly according to an embodiment of the present disclosure.

According to some embodiments of the present disclosure, the functional composite film 21 may be formed by compositing and superposing a plurality of functional sub-layers including, but not limited to, a bubble removing sub-layer 221 (for example, a reticulated adhesive tape sub-layer for removing bubbles when attached), a buffering and shock absorbing sub-layer 222 (for example, a foam tape sub-layer), a heat dissipating and temperature homogenizing sub-layer (for example, a graphite sheet sub-layer), and a thermally conductive and shielding sub-layer 223 (for example, a copper foil tape), a substrate sub-layer (for example, formed of PI or PET)) and so on, as shown in FIG. 5. The flexible screen body 22 serves as a display member, and for example, an OLED display device or an AMOLED display device may be adopted. The reinforcing protection film 23 is attached to the outer display surface of the flexible screen body 22, mainly for providing protection of the display screen body 22 against scratch, and a back surface of the reinforcing protection film 23 may be printed with ink.

FIG. 1 schematically shows the positional relationships among the reinforcing protection film 23, the flexible screen body 22, the functional composite film 21 in the flexible display screen 20 and the frame 10. The flexible display screen 20 is attached to the inner surface of the frame 10 by an adhesive. Moreover, as shown in FIG. 1, the reinforcing protection film 23, the flexible screen body 22, and the functional composite film 21 in the flexible display screen 20 are sequentially arranged in the frame 10 from top to bottom. The functional composite film 21 is attached to the inner surface of the frame 10 by the adhesive, the flexible screen body 22 is attached to the functional composite film 21 by the adhesive, and the reinforcing protection film 23 is attached to the flexible screen body 22 by the adhesive. More specifically, the reinforcing protection film 23 and the flexible screen body 22 may be attached together by a full-surface bonding, and the flexible screen body 22 and the functional composite film 21 may also be attached together by a full-surface bonding, while the flexible display screen 20 (specifically, the functional composite film 21) and the frame 10 may be attached together by an edge bonding. In addition, as shown in FIG. 1, the size of the reinforcing protection film 23 in the flexible display screen 20 is greater than the size of the flexible screen body 22 and greater than the size of the functional composite film 21; and the size of the functional composite film 21 is greater than the size of the flexible screen body 22 (therefore, only the functional composite film 21 and the reinforcing protection film 23 can be seen in the bottom view shown in FIG. 2, but the flexible screen body 22 between the two cannot be seen). Further, the size of the reinforcing protection film 23 in the flexible display screen 20 is substantially equal to the size of the frame 10. In this way, it not only provides a protection function, but also shields the frame to obtain an aesthetic effect.

In the above flexible display screen assembly, the first fixing members are disposed on the functional composite film, and the functional composite film and the first fixing members are integrally formed. As in the embodiment shown in FIGS. 1 to 3, the first fixing members 29 are provided on the functional composite film 21 as shown in FIG. 3. In this embodiment, the first fixing members 29 are provided on the entire functional composite film 21 formed by assembling together and superposing a plurality of functional sub-layers. For example, the first fixing members 29 may be integrally formed with the entire functional composite film 21. In an alternative embodiment, the first fixing members 29 may only be provided on at least one functional sub-layer of the functional composite film 21, and even the first fixing members 29 may be integrally formed with at least one functional sub-layer of the functional composite film 21. For example, the first fixing member 29 may be disposed on the thermally conductive and shielding sub-layer formed of the copper foil tape and/or on the substrate sub-layer formed of PI or PET described above, or even they may be integrated with the corresponding functional sub-layer by using the same material. Since these functional sub-layers have better rigidity, their functionality would not be lost even when the first fixing members are pulled.

In the above flexible display screen assembly, according to some embodiments of the present disclosure, in the terms of structure, the first fixing members 29 are disposed on at least two opposite sides of the functional composite film 21. In the embodiment shown in FIGS. 1 to 3, the first fixing members 29 are disposed on the peripheral sides of the functional composite film 21. Further, a plurality of first fixing members 29 spaced apart from each other are disposed on each side of the functional composite film 21. Accordingly, the second fixing members 19 are formed on the inner surface of the frame 10 and correspond in position to the first fixing members 29 disposed on the functional composite film 21. By means of the above arrangement of the first fixing members and the second fixing members, the displacement of the flexible display screen in any direction relative to the frame can be prevented, and the flexible display screen 20 is further fixed at the original position of the frame 10.

Figure 4:
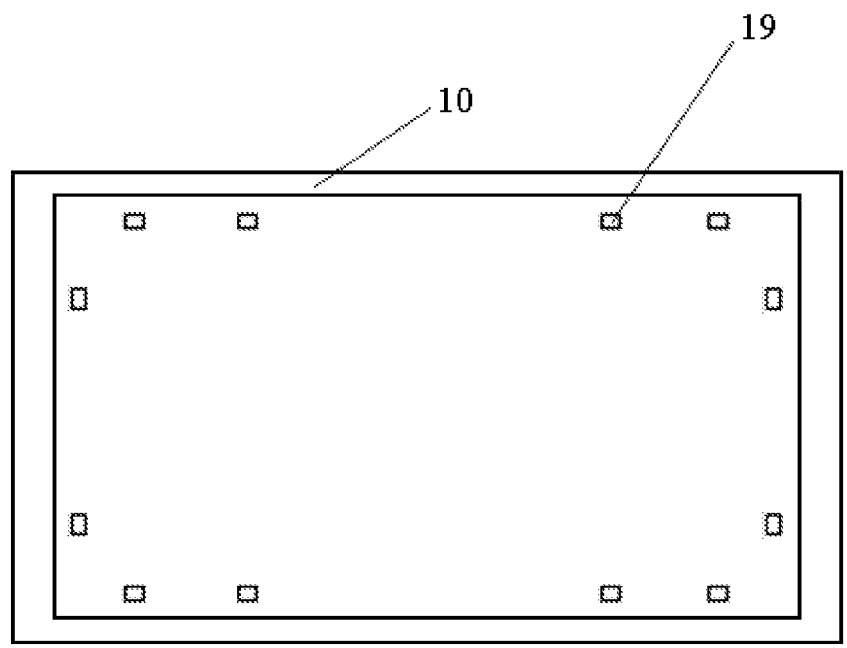
FIG. 4 is a top structural view schematically illustrating a frame in the flexible display screen assembly shown in FIG. 1.

According to some embodiments of the present disclosure, the first fixing members and the second fixing members may adopt any structures that can cooperate with each other to achieve a fixing effect. For example, in the embodiments illustrated in FIGS. 1 to 4, the first fixing members 29 may be a hollow slot (see FIG. 3) and the second fixing members 19 may be a protruding plug that cooperates with the hollow slot (see FIG. 4). The fixing effect may be achieved by the plug-in fit between the protruding plug and the hollow slot. As for the degree of firmness of the plug-in fit between the two, it is only necessary to satisfy that the flexible display screen is fixed at the original position of the frame to prevent the flexible display screen from being displaced relative to the frame even after the adhesive invalids. Further, according to some embodiments of the present disclosure, the flexible display screen assembly further includes an elastic sleeve disposed between an inner circumference of the hollow slot and an outer circumference of the protruding plug. During the assembly, the elastic sleeve is first sleeved outside the protruding plug, and then the flexible display screen 20 is assembled with the frame 10 in such a way that the hollow slot is sleeved outside the elastic sleeve. In this way, the elastic sleeve is sandwiched between the hollow slot and the protruding plug, and the elastic force of the elastic sleeve further enhances the fastening effect between the protruding plug and the hollow slot. Certainly, in other embodiments, the first fixing members and the second fixing members may also adopt any suitable structures that can cooperate with each other to achieve a fixing effect, as needed. According to some embodiments of the present disclosure, the functional composite film 21 and the first fixing members 29 may be integrally formed by using the same material. In this way, the functional composite film having the first fixing members may be formed without adding any manufacturing processes and manufacturing materials. Moreover, the first fixing members 29 are disposed on the respective periphery sides of the functional composite film 21. In this way, the fixing effect between the flexible display screen and the frame can be enhanced without affecting the layout of the functional composite film 21 or even the flexible display screen 20 in the frame 10.

In the above flexible display screen assembly, as shown in FIG. 2, the flexible display screen 20 is further divided into a bendable zone 20a adapted to be bent in a folded state and non-bendable zones 20b that cannot be bent in the folded state, according to whether it is easily bent in the folded state. According to some embodiments of the present disclosure, the first fixing members 29 are provided on the sides of the functional composite film 21 located in the non-bendable zones 20b. With the above configuration, the flexible display screen assembly provided by the embodiments of the present disclosure would not affect or hinder the folding effect of the flexible display screen structure even if the first and second fixing members for reinforcing the fixing effect between the flexible display screen and the frame are provided.

Figure 6:
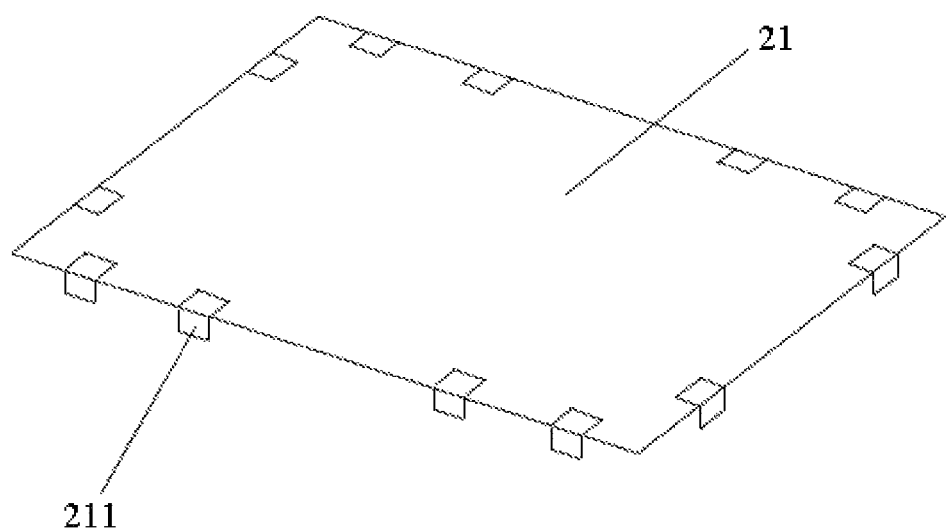
FIG. 6 is a schematic view of a functional composite film according to one example of an embodiment of the present disclosure.
Figure 7:
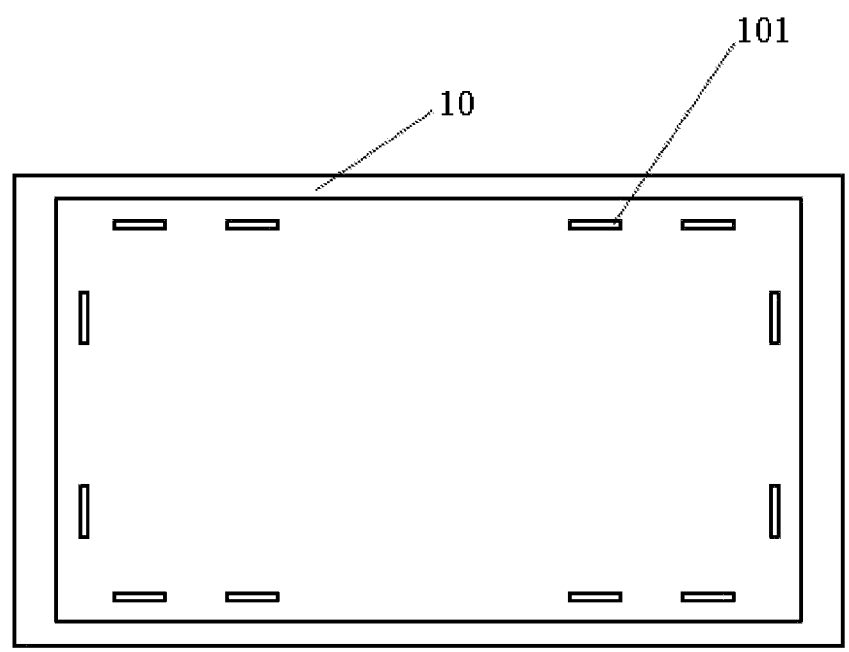
FIG. 7 is a top structural view schematically illustrating a frame according to one example of an embodiment of the present disclosure.

FIGS. 6 to 7 illustrate a flexible display screen assembly according to an example, which is different from the embodiments shown in FIGS. 1 to 4 in that: retaining tabs 211 serving as the first fixing members are disposed on the functional composite film 21, and the second fixing members in the frame 10 are constructed as retaining slits 101. The material of the retaining tabs 211 is not limited, and they may be attached to one surface of the functional composite film 21 by an adhesive, for example, as shown in FIG. 6, they are attached to a surface of the functional composite film 21 away from the frame 10. Alternatively, the retaining tabs 211 are attached to a surface of the functional composite film 21 away from the display side, such an arrangement is advantageous, because if the retaining tabs 211 are disposed in this way, it would not interfere with the flexible screen body 22, and thus it would not affect the display. In FIG. 6, in order to show the retaining tabs 211, they are placed on the surface of the functional composite film 21 away from the frame 10. However such an arrangement is not compulsive. Correspondingly, retaining slits 101 are provided on the frame 10 for cooperating with the retaining tabs 211.

As an example, the retaining tab 211 may be configured to include a first sub-tab and a second sub-tab perpendicular to each other, the first sub-tab being attached to the functional composite film 21 by an adhesive, and the second sub-tab being configured for being inserted into the retaining slit 101 of the frame 10.

In this example, the retaining tab 211 and the retaining slit 101 cooperate with each other to secure the flexible display screen 20 to the frame 10, in particular, the retaining tab 211 may be inserted into the retaining slit 101, thereby limiting the movement of the flexible display screen relative to the frame. By the mutual cooperation between the retaining tabs 211 and the retaining slits 101, even if the adhesive between the flexible display screen 20 and the frame 10 is subjected to creep due to a long-term pulling force in the folded state of the display screen, the flexible display screen 20 may be still kept to be fixed at the original position of the frame 10, preventing the flexible display screen from being displaced relative to the frame, and thereby ensuring the display effect.

In the above flexible display screen assembly, the retaining tabs 211 are disposed on at least two opposite sides of the functional composite film 21. In the embodiments shown in FIGS. 6 to 7, the retaining tabs 211 are disposed at respective peripheral sides of the functional composite film 21. Further, a plurality of retaining tabs 211 spaced apart from each other are disposed on each side of the functional composite film 21. Accordingly, the retaining slits 101 are formed on the inner surface of the frame 10 and correspond in position to the retaining tabs 211 disposed on the functional composite film 21. By means of the above arrangement of the retaining tabs 211 and the retaining slits 101, the displacement of the flexible display screen in any direction relative to the frame can be prevented, and the flexible display screen 20 is further fixed at the original position of the frame 10.

The flexible display screen assembly according to the embodiments of the present disclosure may be applied to a flexible display screen structure suitable for OLED display, and may also be applied to a flexible display screen structure suitable for AMOLED display. The specific details thereof can be set according to the actual situation, and therefore will not be described here.

Further, the flexible display screen assembly according to the embodiments of the present disclosure may be applied to an ordinary flexible display screen structure, and may also be applied to a flexible display screen structure having a touch function. The specific details thereof can be set according to the actual situation, and therefore will not be described here.

In addition, the flexible display screen assembly according to the embodiments of the present disclosure may be applied to a flexible display screen structure of a single-sided display, or may also be applied to a flexible display screen structure of a double-sided display. The specific details thereof can be set according to the actual situation, and therefore will not be described here.

According to another aspect of the present disclosure, there is also provided a flexible display device. The flexible display device includes: the flexible display screen assembly disclosed in any of the preceding embodiments as described, and other components that are an integral part of the display device. The flexible display device provided by the embodiments of the present disclosure includes, but not limited to, a liquid crystal panel, an electronic paper, an organic light emitting diode panel, a mobile phone, a tablet computer, a television, a display, a notebook computer, a digital photo frame, a navigator, and any other flexible display products or parts having a display function.

As described above, in the flexible display screen assembly and the flexible display device provided by the embodiments of the present disclosure, on the basis of the flexible display screen being attached to the frame by an adhesive, the fixing members configured to cooperate with each other are respectively provided on the flexible display screen and the frame, it not only provides effective positioning between the flexible display screen and the housing, but also enhances the adhesion and fixing effect between the flexible display screen and the housing. Therefore, even when the product of flexible display screen is in a state in which the display screen is folded for a long time, the displacement of the flexible display screen relative to the frame may be prevented, thereby ensuring the display effect.

While some embodiments of the present disclosure have been shown and described, it will be understood by those skilled in the art that changes may be made to those embodiments without departing from the principle and spirit of the present disclosure, and the scope of the present disclosure is defined by the claims and their equivalents.

What is claimed is:

1. A flexible display screen assembly, comprising:
   a frame; and
   a flexible display screen adapted to the frame,
   wherein the flexible display screen comprises at least one first fixing member, and the frame comprises at least one second fixing member that is engaged with the at least one first fixing member;

wherein the flexible display screen comprises a functional film, and the at least one first fixing member is disposed on the functional film; and wherein the at least one first fixing member comprises a plurality of first fixing members, and the plurality of first fixing members are disposed on at least two opposite sides of the functional film.

2. The flexible display screen assembly according to claim 1, wherein the functional film and the at least one first fixing member are integrally formed.

3. The flexible display screen assembly according to claim 2, wherein the flexible display screen is attached to the frame by an adhesive disposed between the frame and the functional film.

4. The flexible display screen assembly of according to claim 2, wherein the at least one first fixing member is a hollow slot and the at least one second fixing member is a protruding plug that is engaged with the hollow slot.

5. The flexible display screen assembly according to claim 1, wherein the first fixing members are disposed at respective peripheral sides of the functional film.

6. The flexible display screen assembly according to claim 5, wherein a plurality of said first fixing members spaced apart from each other are disposed on each side of the functional film.

7. The flexible display screen assembly according to claim 1, wherein the flexible display screen comprises a bendable zone and a non-bendable zone, and the at least one first fixing member is disposed on a side of the functional film located in the non-bendable zone.

8. The flexible display screen assembly according to claim 1, wherein the flexible display screen further comprises a flexible screen body and a reinforcing protection film;

wherein the reinforcing protection film is attached to a display surface of the flexible screen body, and the functional film is attached to the other surface of the flexible screen body facing away from the display surface.

9. The flexible display screen assembly according to claim 8, wherein a projection of the at least one first fixing member on the flexible screen body is located outside a projection of the functional film on the flexible screen body.

10. The flexible display screen assembly of according to claim 1, wherein the at least one first fixing member is a hollow slot and the at least one second fixing member is a protruding plug that cooperates with the hollow slot.

11. The flexible display screen assembly according to claim 1, wherein the at least one first fixing member is a retaining tab and the at least one second fixing member is a retaining slit that is engaged with the retaining tab.

12. The flexible display screen assembly according to claim 1, wherein the functional film is formed by assembling together and superposing a plurality of functional sub-layers, and the at least one first fixing member is disposed on at least one of the plurality of functional sub-layers.

13. The flexible display screen assembly according to claim 12, wherein the functional sub-layers comprise: a bubble removing sub-layer, a buffering and shock absorbing sub-layer, a heat dissipating and temperature homogenizing sub-layer, and a thermally conductive and shielding sub-layer, wherein the at least one first fixing member is integrally formed with at least one of the bubble removing sub-layer, the buffering and shock absorbing sub-layer, the heat dissipating and temperature homogenizing sub-layer, and the thermally conductive and shielding sub-layer.

14. The flexible display screen assembly according to claim 1, wherein the flexible display screen assembly is configured for OLED display and/or AMOLED display.

15. A flexible display device, comprising the flexible display screen assembly according to claim 1.

16. The flexible display screen assembly of according to claim 1, wherein the at least one first fixing member is a hollow slot and the at least one second fixing member is a protruding plug that is engaged with the hollow slot, and wherein the functional film is formed by assembling together and superposing a plurality of functional sub-layers, and the at least one first fixing member is disposed on at least one of the plurality of functional sub-layers.

17. The flexible display screen assembly of according to claim 1, wherein the at least one first fixing member is a retaining tab and the at least one second fixing member is a retaining slit that cooperates with the retaining tab, and wherein the functional film is formed by assembling together and superposing a plurality of functional sub-layers, and the at least one first fixing member is disposed on at least one of the plurality of functional sub-layers.

18. The flexible display screen assembly according to claim 1, wherein the flexible display screen comprises a bendable zone and a non-bendable zone, and the at least one first fixing member is disposed on a side of the functional film located in the non-bendable zone, and wherein the at least one first fixing member is a hollow slot and the at least one second fixing member is a protruding plug that is engaged with the hollow slot.

19. The flexible display screen assembly according to claim 1, wherein the flexible display screen comprises a bendable zone and a non-bendable zone, and the at least one first fixing member is disposed on a side of the functional film located in the non-bendable zone, and wherein the at least one first fixing member is a retaining tab and the at least one second fixing member is a retaining slit that is engaged with the retaining tab. .

* * * * *